(12) United States Patent
Adams (10) Patent No.: US 6,192,290 B1
(45) Date of Patent: Feb. 20, 2001

(54) SYSTEM AND METHOD OF MANUFACTURING SEMICUSTOM INTEGRATED CIRCUITS USING RETICLE PRIMITIVES FROM A LIBRARY AND INTERCONNECT RETICLES

(75) Inventor: Thomas E. Adams, Orlando, FL (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/082,924

(22) Filed: May 21, 1998

(51) Int. Cl.[7] .................................................... G06F 19/00
(52) U.S. Cl. .............................. 700/121; 700/95; 700/117
(58) Field of Search ........................ 710/65, 72; 700/95, 700/121, 117; 438/143, 310, 471

(56) References Cited

U.S. PATENT DOCUMENTS

| | | | |
|---|---|---|---|
| 4,918,594 | * 4/1990 | Onizuka | 364/200 |
| 5,497,331 | * 3/1996 | Iriki et al. | 700/95 |
| 5,740,052 | * 4/1998 | Nakamura | 700/121 |
| 5,933,350 | * 8/1999 | Fujimoto et al. | 700/121 |
| 5,969,972 | * 10/1999 | Kerszykowski et al. | 700/121 |
| 5,993,043 | * 11/1999 | Fujii | 700/121 |

* cited by examiner

Primary Examiner—Thomas C. Lee
Assistant Examiner—Thuan Du

(57) ABSTRACT

A system for, and method of, manufacturing an integrated circuit (IC) and an IC manufactured by the method. In one embodiment, the system includes: (1) a library of reticle primitives, at least two of the reticle primitives containing patterns corresponding to circuit modules to be contained in the IC, (2) an interconnect reticle containing patterns corresponding to interconnecting conductors for electrically coupling the circuit modules and (3) lithographic equipment that employs the at least two of the recticle primitives and the interconnect reticle to create a lithograph of the circuit modules and the interconnecting conductors.

33 Claims, 7 Drawing Sheets

SYSTEM AND METHOD OF MANUFACTURING SEMICUSTOM INTEGRATED CIRCUITS USING RETICLE PRIMITIVES FROM A LIBRARY AND INTERCONNECT RETICLES

TECHNICAL FIELD OF THE INVENTION

The present invention is directed, in general, to semiconductor fabrication and, more specifically, to a system and method of manufacturing semicustom integrated circuits (ICs) by employing selected ones from a library of reticle primitives and custom-made interconnect reticles.

BACKGROUND OF THE INVENTION

Integrated circuits generally contain millions of individual electronic devices, each typically the size of a few micrometers, and interconnections thereamong. As a result, no "physical" tool is adequate for fabricating the complex patterns representing the devices and interconnections on a semiconductor substrate. Instead, microelectronic patterning is conventionally performed by radiation, e.g., light, x-rays or electron beams. The process of using an optical image and a photosensitive film to produce a pattern on a semiconductor substrate is known as "photolithography."

In photolithography, a film of a photoresist (photosensitive film) is first applied to the substrate. Radiation is then projected through a transparent plate, or "mask," on which has been created a desired pattern in an opaque material. The resulting image is focused on the photoresist-coated substrate, yielding areas of light and shadow on the substrate that correspond to the image on the mask plate. Following development and etching processes, where portions of the resist and substrate are removed, a pattern corresponding to that on the mask is etched in the substrate film.

During the infancy of microelectronics, the master image (pattern) was photographically reduced from a macroscopic original. The desired pattern was cut by hand into a colored plastic sheet and the image reduced to the desired size using room-sized reduction cameras. This method has been replaced by a pattern generator, an apparatus that accepts a computer-generated description of the device and analyzes it into individual picture frames. The pattern generator then scans a mask plate, "writing" the pattern on the mask plate using, for example, a high intensity electron beam, to expose each device or interconnect in the pattern.

Semiconductor devices may typically be made up of as many as fifty individual layers of silicon, polysilicon, silicon dioxide, metal and silicides. The pattern for each layer is contained on a mask called a reticle. Reticles are generally between one and ten times the actual size of the pattern they produce. The group of reticles that corresponds to all the layers of an integrated circuit (IC) is called a device series.

The pattern generation process, requiring point-to-point creation of a complex pattern on a semiconductor wafer, is generally a slow process. Usually only one of the multiple devices images to be printed on a semiconductor substrate is pattern-generated. The single device pattern, or reticle, is then replicated repeatedly using a step-and-repeat camera (commonly known as a stepper) to form the array of devices and interconnects that cover the semiconductor substrate. The reticle may also consist of an array of several patterns and is distinguished from a mask that contains patterns that can be transferred to an entire semiconductor wafer (or to another mask) in one exposure.

Not only is the production of a reticle a slow process, it is also an expensive process. Multiplying the cost of a single reticle by the number of reticles in a device series illustrates the cost of producing a single new IC. The reticles' cost is a significant component of the overall cost in the design and development of a new, or custom, semiconductor device. During the design and development of a semiconductor device, changes in the design, due to changes in the design specifications or unexpected results during testing, are often encountered. The changes in the design will necessitate new reticles to implement the changed design. This not only increases the cost of the development of the semiconductor device, but also delays the verification and production phases of the semiconductor device.

Accordingly, what is needed in the art is an improved method to manufacture an IC that overcomes the above-described limitations.

SUMMARY OF THE INVENTION

To address the above-discussed deficiencies of the prior art, the present invention provide a system for, and method of, manufacturing an IC and an IC manufactured by the method. In one embodiment, the system includes: (1) a library of reticle primitives, at least two of the reticle primitives containing patterns corresponding to circuit modules to be contained in the IC, (2) an interconnect reticle containing patterns corresponding to interconnecting conductors for electrically coupling the circuit modules and (3) lithographic equipment that employs the at least two of the reticle primitives and the interconnect reticle to create a lithograph of the circuit modules and the interconnecting conductors.

The present invention therefore introduces the broad concept of building a library of preexisting reticles that correspond to often-used circuit modules and generating a semicustom ICs by lithographing some of the circuit modules in one step and lithographing interconnections between the circuit modules in a separate step. For purposes of the present invention, "reticle primitive" is defined as a set of reticles used for the process levels in the formation of a circuit module. "Circuit module" is, in turn, defined as a piece of circuitry that can be employed as a building block to construct a larger circuit. For instance, a semicustom IC suitable for telecommunications may employ such circuit modules as digital-to-analog (D/A) and analog-to-digital (A/D) converter circuitry, filters, a processor and. associated memory banks. Reticle primitives corresponding to each of these circuit modules may be lithographed and interconnected in separate steps (and the steps performed in either order).

In one embodiment of the present invention, the at least two of the reticle primitives are free of patterns corresponding to bond pads for the circuit modules. Because the circuit modules on the IC may be interconnected by traces on the IC itself, conventional bond pads are rendered unnecessary. Instead, far smaller interconnection points may be provided on the reticle primitives.

In one embodiment of the present invention, the at least two of the reticle primitives are free of patterns corresponding to protected drive transistors for the circuit modules. Likewise, because of the proximity of the circuit modules to one another in the single IC, conventional protected drive transistors are no longer needed. In some cases, direct interconnections may be made without any additional drive transistors whatsoever.

In one embodiment of the present invention, the circuit modules are selected from the group consisting of: (1) static random access memory (SRAM) modules, (2) electrically eraseable programmable read-only memory (EEPROM) modules, (3) field-programmable gate array (FPGA) modules, (4) programmable logic array (PLA) modules, (5) D/A converter modules, (6) A/D converter modules, (7) digital signal processor (DSP) modules, (8) microprocessor modules, (9) microcontroller modules, (10) linear amplifier modules and (11) filter modules. Those skilled in the art will recognize, however, that many circuits can be constructed of well-known circuit modules. The present invention extends to all conventional and later-discovered circuit modules.

In one embodiment of the present invention, the lithographic equipment subjects each of the at least two of the reticle primitives to multiple exposures. Thus, the reticle primitives may be projected onto different locations on a given wafer to fabricate a plurality of ICs on the wafer.

In one embodiment of the present invention, the lithographic equipment first employs the at least two of the reticle primitives to create a lithograph containing the circuit modules and subsequently employs the interconnect reticle to add the interconnecting conductors to the lithograph. Of course, these operations can be carried out in reverse order or concurrently.

In one embodiment of the present invention, the lithographic equipment comprises a reticle exchanger that allows the at least two of the reticle primitives and the interconnect reticle to be sequentially exchanged. This allows automatic substitution of reticle primitives without requiring human intervention. Of course, the present invention is not restricted to automatic substitution.

The foregoing has outlined, rather broadly, preferred and alternative features Of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
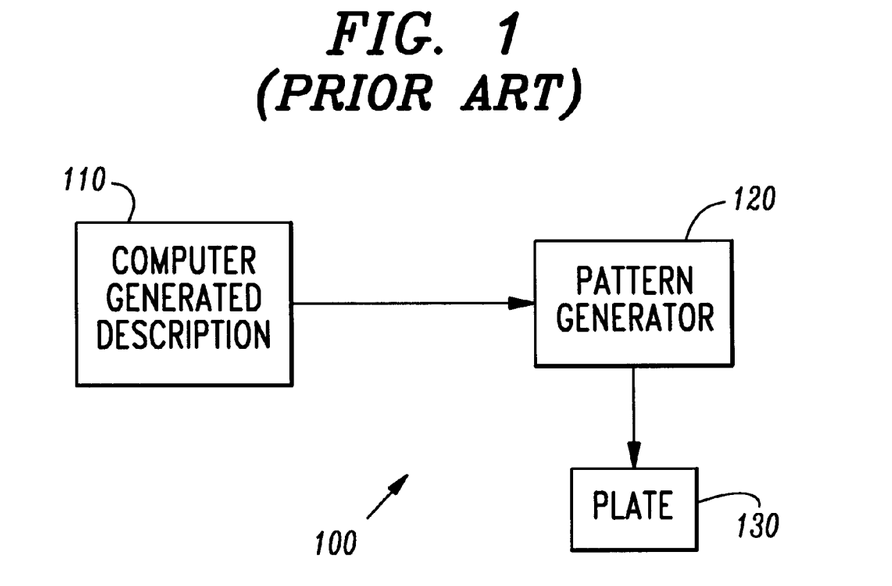
FIG. 1 illustrates a block diagram of an exemplary semiconductor pattern preparation process.

Referring initially to FIG. 1, illustrated is a block diagram of an exemplary semiconductor pattern preparation process 100. The process 100 includes a computer-generated description 110, such as a design tape or graphic computer-aided-design (CAD) data, of circuit patterns, that is converted to a machine language. The description 110 is provided to an exposure "write" system or pattern generator 120, such as a laser pattern generator or an e-beam pattern generator, that scans a plate 130, writing the pattern on the plate using a directed beam of light or electron beam to expose each element in the pattern. Generally, apertures in the pattern generator 120 are varied to produce rectangles of various sizes that are used to create the overall pattern.

The pattern generation process, requiring point-to-point creation of a complex pattern is generally a slow process. Generally, only one of the multiple devices images to be printed on a semiconductor substrate is pattern-generated. The single device pattern, or reticle, is then replicated repeatedly to form the array of devices that cover the semiconductor substrate. It should be noted that a reticle may also consist of an array of several patterns and is distinguished from a mask that contains patterns that can be transferred to an entire semiconductor wafer (or another mask) in one exposure.

Figure 2:
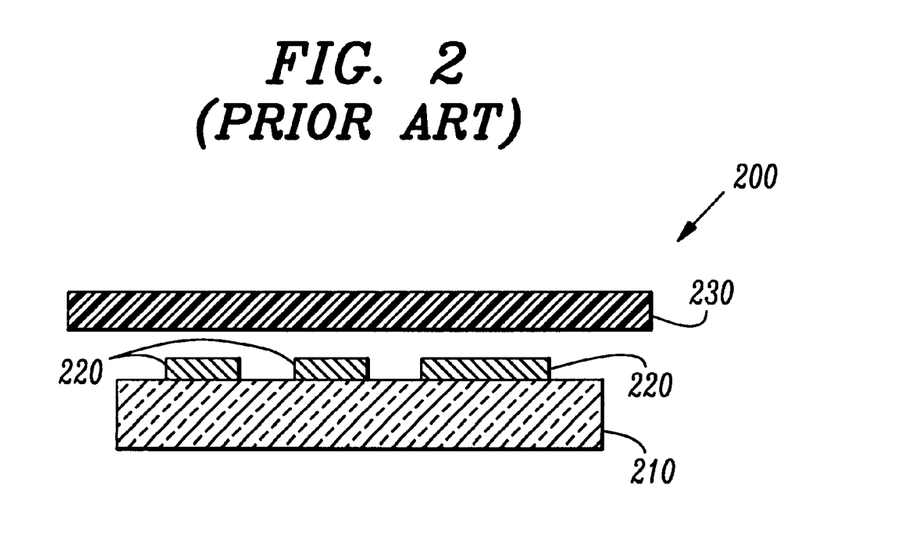
FIG. 2 illustrates a cross-sectional view of an exemplary reticle assembly.

Turning now to FIG. 2, illustrated is a cross-sectional view of an exemplary reticle 200 assembly. The reticle assembly 200 includes a substrate 210, typically composed of an optically clear quartz material, upon which a metal, such as chromium, pattern (generally designated 220) is formed using the processes discussed previously. The substrate 210 and the pattern combine to form a reticle. A pellicle 230, composed of a material such as plastic, is mounted generally a short distance away from the surface of the reticle to keep the reticle's surface clean. The pellicle 230 insures that any microscopic dust that settles on the reticle will be out of focus during exposure and does not create defects on the semiconductor wafer.

The present invention recognizes that changes in the design of a semiconductor device, e.g., changes in the design specifications or unexpected results during testing, often necessitate new reticles and may significantly increase the cost and delay production of the new device. The present invention introduces the concept of building a library of preexisting reticles that correspond to often-used circuit modules and generating semicustom ICs by lithographing some of the circuit modules in one step and lithographing interconnections between the circuit modules in a separate step ("microboarding"). The use of existing reticles of proven circuit modules to form basic "building blocks" avoids the cost of new reticles and tends to shorten the development cycle.

Figure 3:
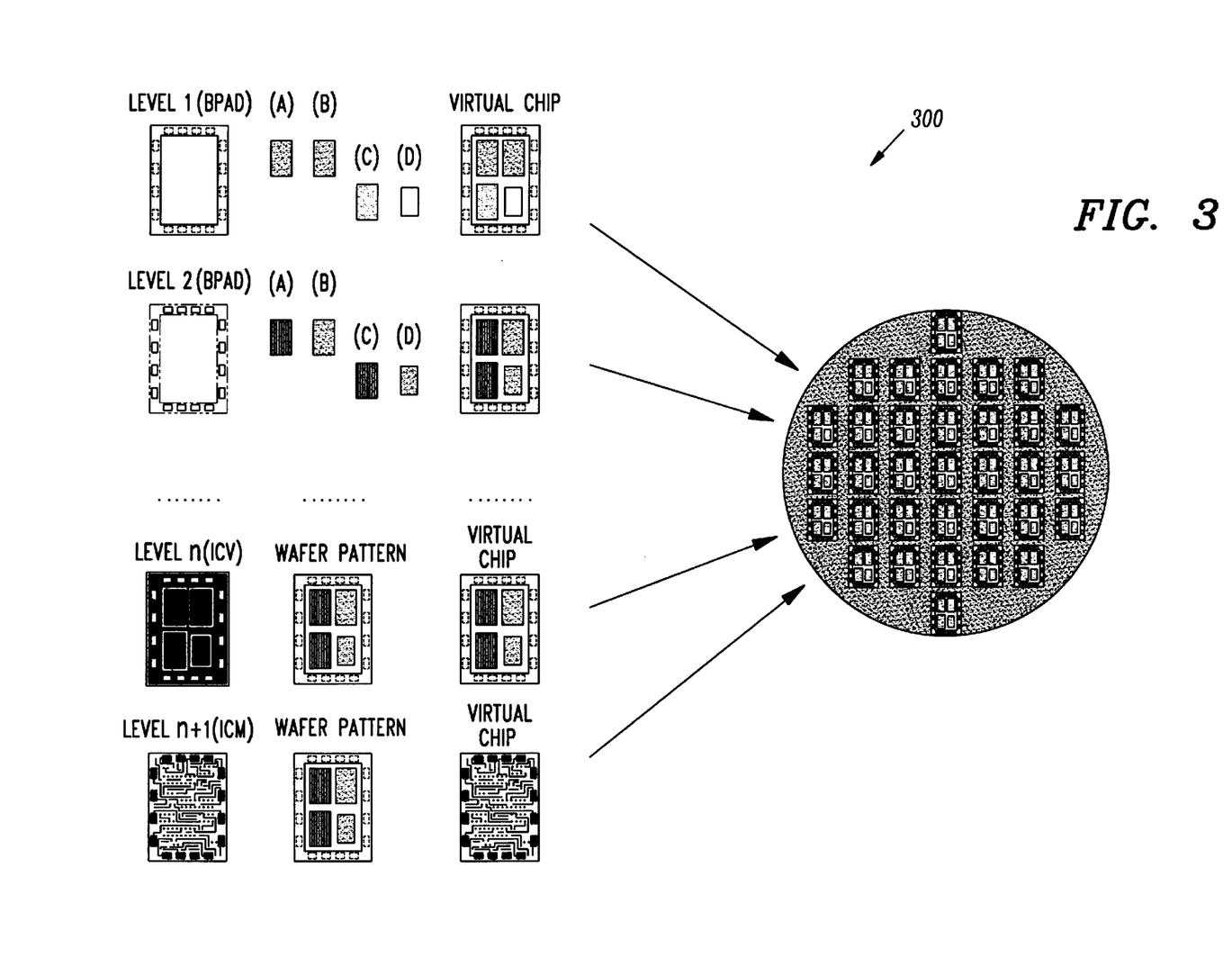
FIG. 3 illustrates a "high-level" overview of an embodiment of a microboard process.

Before describing the present invention in detail, an overview of the methodology of the present invention will be presented. A "high-level" overview of an embodiment of a microboard process 300 is illustrated in FIG. 3. The microboard process 300 overview highlights the different process sequences involved, beginning with level 1 (isolation layer) through level n (via formation) and level n+1 (metallization).

Figure 4:
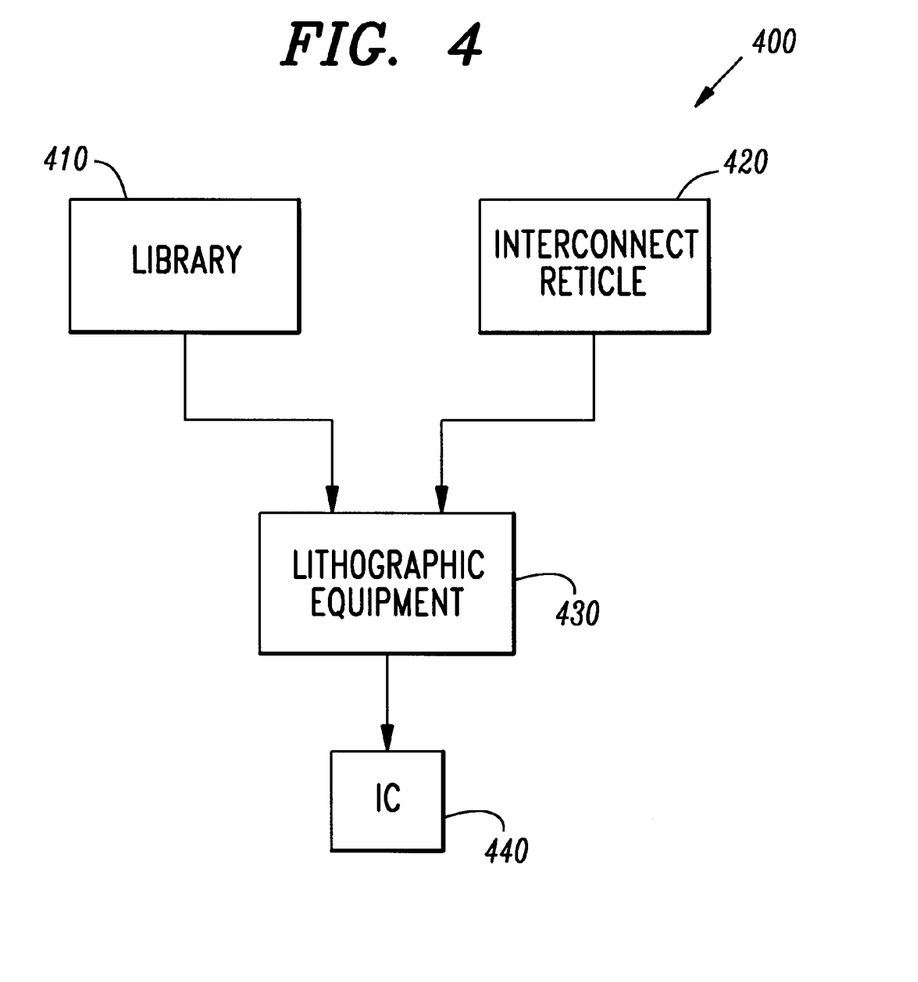
FIG. 4 illustrates a block diagram of an embodiment of a microboarding methodology using the principles of the present invention.

Turning now to FIG. 4, illustrated is a block diagram of an embodiment of a microboarding methodology 400 using the principles of the present invention. In the illustrated embodiment, a library 410, containing reticle primitives of standard functional circuit modules, such as static random access memories (SPAMs), is shown coupled to a lithographic equipment 430. Those skilled in the art should readily appreciate that the library 410 may also contain, in advantageous embodiments, reticle primitives of standard electrically erasable programmable read-only memory (EEPROM) modules, field-programmable gate array (FPGA) modules, programmable logic array (PLA) modules, digital-to-analog (D/A) converter modules, analog-to-digital (A/D) converter modules, digital signal processor (DSP) modules, microprocessor modules, microcontroller modules, linear amplifier modules and filter modules. An interconnect reticle 420 is also shown coupled to the lithographic equipment 430.

In an advantageous embodiment, the reticle library of standard functional modules of varying sizes and capabilities, e.g., 2 kbytes, 4 kbytes, 8-bits or 16-bits, are designed with layouts that are free of patterns corresponding to standard bond pads and protected drive resistors, thereby saving wafer area. Instead, the standard functional modules are provided with smaller vias (e.g., on the order of 10 $\mu$m) with modest intrachip drive capabilities that provide a more area-efficient way to interconnect modules.

In another embodiment, a standard set of reticles with bondpad/drive transistor frames, or blind-selectable, stackable horizontal/vertical "sticks" of pads and grid features may be used with a conventional high speed changer in the lithographic equipment 430 to form a custom IC 440 in "real time."

Since the interconnections between the standard functional modules are preferably performed as a back end process, fewer new reticles (essentially the interconnection reticles) would be required. Furthermore, with new reticles required only for the back end processing, front end processing, i.e., forming electrically active device layers, may be initiated immediately and processing continued to the back end without waiting for the specialized glass needed for the reticles. This allows decisions regarding the final design to be delayed until the interconnection stages, permitting design changes with minimal attendant costs.

Using standard functional modules avoids the design rules for the interconnect levels of a new circuit module with its associated manufacturing difficulties and costs, especially those associated with "stitching" and waferscale integration. Also, the often expensive and demanding design rule for the reticles of the functional modules is already known and resident in a library, with known histories and yields. What remains are a few, relatively "coarse" address structure interconnect levels that have lower production and inspection costs and lower defect rates.

Reticle primitives corresponding to new circuit modules can be added to the functional module library over time without changing the entire reticle library. This provides added flexibility, faster development cycles and lower risks in terms of design and production. A circuit designer is able to "fine-tune" or change design or functional capabilities of his circuit without incurring the costs of an entire new reticle set or waiting for the cycle, e.g., prototype design/pattern-layout/IC-production, to complete. The standard modules or the interconnects could be substituted or changed with minimal costs.

Figure 5A:
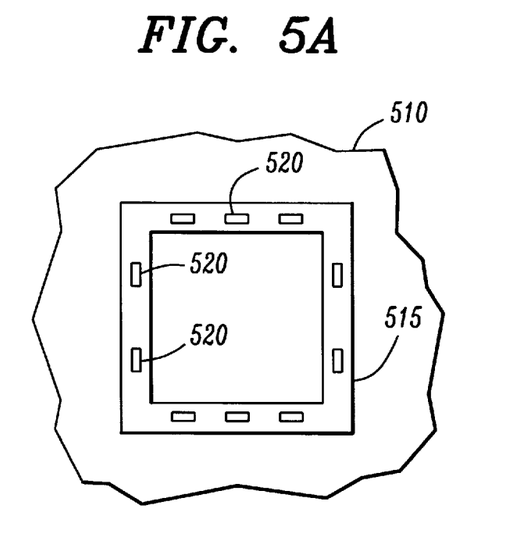
FIG. 5A illustrates an embodiment of an exemplary section of a semiconductor wafer with a bond pad frame.

Turning now to FIGS. 5A, 5B, 5C and 5D, illustrated are various stages in the construction of an exemplary IC using the principles of the present invention. Specifically, FIG. 5A illustrates an embodiment of an exemplary section of a semiconductor wafer 510 with a bond pad frame 515. Within the bond pad frame 515 is a plurality of bond pads (generally designated 520). In an advantageous embodiment, the bond pad frame 515 also includes drive transistors (not shown). In yet another advantageous embodiment, the bond pad frame 515 includes blind-selectable, stackable horizontal/vertical sticks of pads and grid features.

Figure 5B:
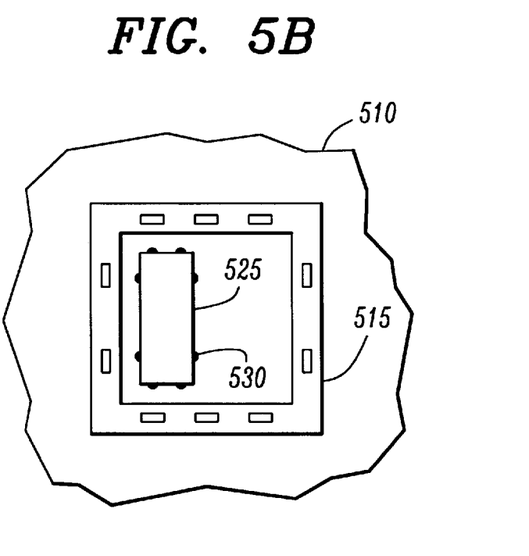
FIG. 5B illustrates a semiconductor wafer with a first circuit module.

Turning now to FIG. 5B, illustrated is the semiconductor wafer 510 with a first circuit module 525. In the illustrated embodiment, the wafer 510 includes the first circuit module 525 with a plurality of via pads (generally designated 530) that is enclosed within the bond pad frame 515. The via pads 530 provide for electrical connections to other circuit modules within an IC (not shown) or to the bond pads 520 that provide for electrical connections from other electrical devices, such as a power supply, to the IC.

Figure 5C:
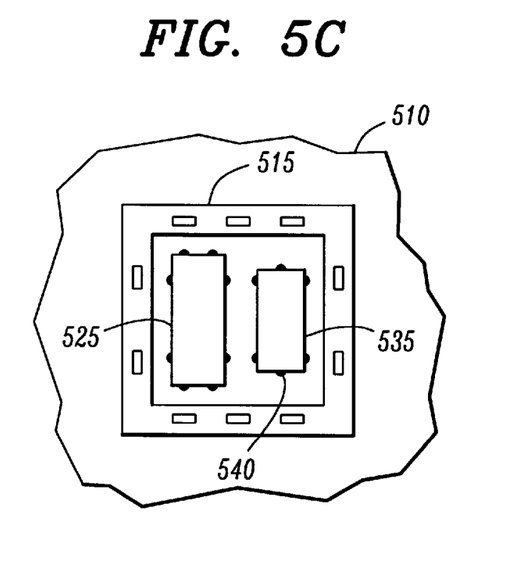
FIG. 5C illustrates a semiconductor wafer with first and second circuit modules.

Turning now to FIG. 5C, illustrated is the semiconductor wafer 510 with first and second circuit modules 525, 535. The wafer 510 includes the first and second circuit modules 525, 535, each with a plurality of via pads 530, 540, respectively. It should be noted that the first and second circuit modules 525, 535 may be fabricated with different "processes." For example, the first circuit module 525 may be a charge-coupled device (CCD) and the second circuit module 535 a flash erasable programmable read-only memory (EPROM). Those skilled in the art should readily appreciate that the present invention is not limited to any particular process technology.

Figure 5D:
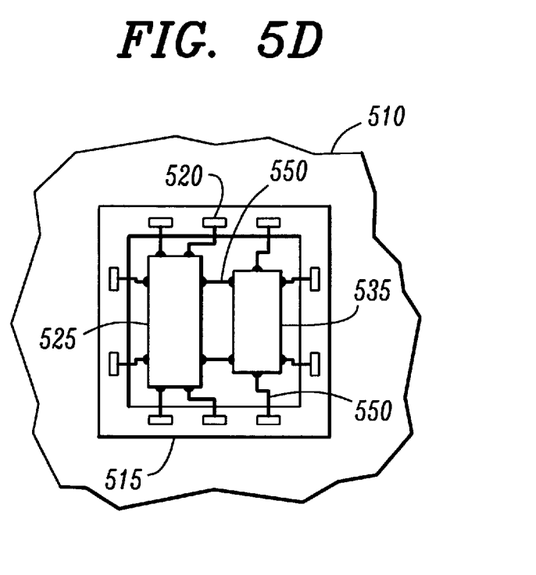
FIG. 5D illustrates an embodiment of an IC constructed using principles of the present invention.

Turning now to FIG. 5D, illustrated is an embodiment of an IC constructed using the principles of the present invention. The IC includes the first and second circuit modules 525, 535 that are electrically coupled to each other with a plurality of conductive traces (generally designated 550). The conductive traces 550 are connected between the first and second circuit modules' via pads 530, 540. The first and second circuit modules' via pads 530, 540 are also shown coupled to the bond pads 520 (via conductive traces 550) that provide the IC with electrical connection points to other electrical devices.

Figure 6:
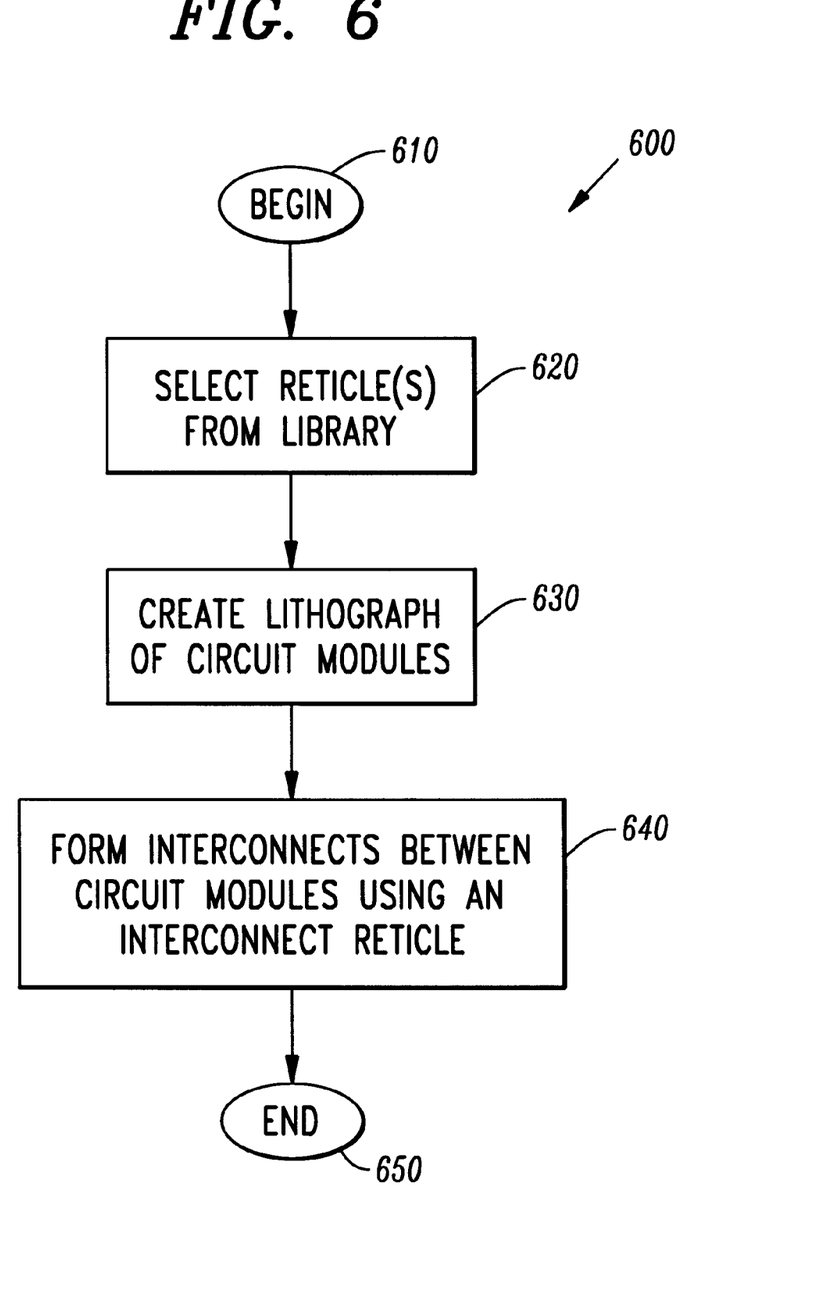
FIG. 6 illustrates a flowchart of an embodiment of an IC manufacturing process using principles of the present invention.

FIGS. 5A, 5B, 5C and 5D, illustrating the construction of an IC using the principles of the present invention, may be explained in greater derail in conjunction with FIG. 6.

Turning now to FIG. 6, with continuing reference to FIGS. 5A, 5B, 5C and 5D, illustrated is a flowchart of an embodiment of an IC manufacturing process 600 using the principles disclosed by the present invention. The IC manufacturing process 600 begins in step 610.

In step 620, a lithograph of the bond pad frame 515 is formed over the semiconductor wafer 510 using conventional processes. The lithograph of the bond pad frame 515 is formed with a reticle that includes patterns corresponding to the bond pads 520 and/or drive transistors (not shown). In an advantageous embodiment, the bond pad frame's 515 reticle is a standard, or fixed package size, grid array with bond pads and/or drive transistors. All the standard circuit modules reticles that make up the IC are selected from a library of reticle primitives. As discussed previously, the reticles that are resident in the library are reticles of standard circuit modules that have well-established and proven manufacturing and yield histories.

Using the selected reticles, lithographs of the first and second circuit modules 525, 535 are formed (in a step 630)

on photoresist material (previously deposited), using conventional processes, on the semiconductor wafer 510 using conventional lithographic equipment, such as a stepper, one lithograph at a time. In other advantageous embodiments, multiple reticles may be exposed at a time or a reticle may be subjected to multiple exposures. The present invention does not limit the exposure of a reticle to a particular number or sequence. After the first and second circuit modules' 525, 535 circuit patterns have been formed on the wafer 510, conventional etching processes are employed to form the first and second circuit modules 525, 535.

Figure 7A:
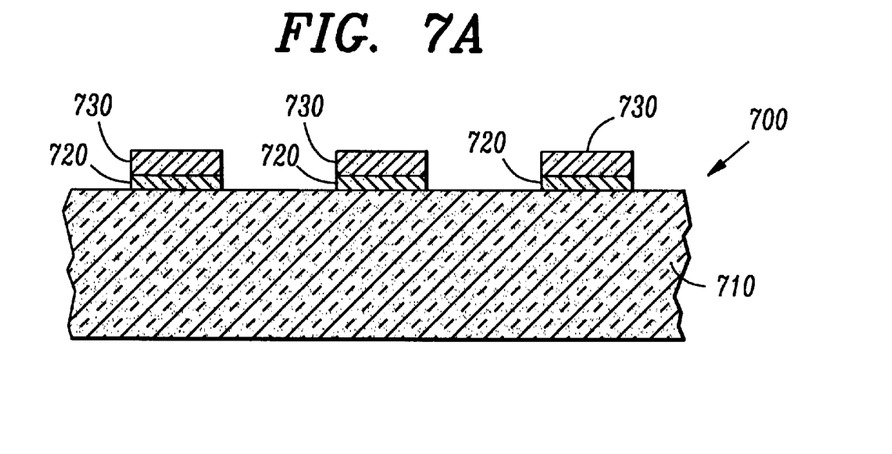
FIG. 7A illustrates a cross-sectional view of an exemplary isolation layer of a semiconductor wafer.

To further describe this aspect of the present invention in greater detail, consider the following example in conjunction with FIGS. 7A, 7B, 7C and 7D. FIG. 7A illustrates a cross-sectional view of an exemplary isolation layer of a semiconductor wafer 700. The semiconductor wafer 700 (analogous to the semiconductor wafer 510) includes a substrate 710 and a pad oxide 720, typically composed of silicon dioxide ($SiO_2$) that has been thermally grown on the substrate 710. A nitride layer 730 of silicon nitride is deposited over the pad oxide 720 using conventional processes, such as chemical vapor deposition (CVD), to provide an oxidation mask. Active regions on the substrate 710 are then defined with a photolithographic process. The nitride layer 730 and the pad oxide 720 are removed again using conventional processes, typically dry-etching. Following removal of the pad oxide 720 and the nitride layer, an implant of boron ($p^+$) or arsenic ($n^+$) is placed in the substrate's field regions to create a channel stop doping layer under the field oxide regions. The field oxide is then thermally grown, e.g., by means of wet oxidation, in the areas where no masking nitride exists. After the formation of the field oxide regions, the masking layer (the pad oxide 720 and the nitride layer 730) is removed.

Figure 7B:
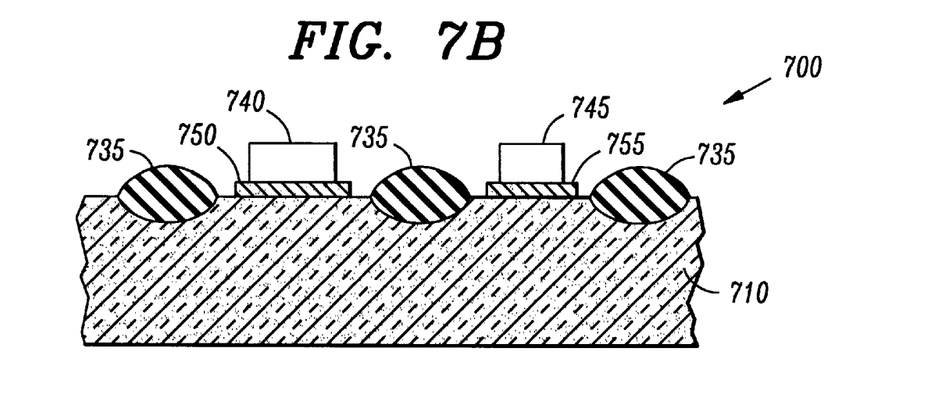
FIG. 7B illustrates a cross-sectional view of an exemplary gate layer of the semiconductor of FIG. 7A.

Turning now to FIG. 7B, illustrated is a cross-sectional view of an exemplary gate layer (not separately referenced) of the semiconductor 700. The gate layer, also known as the active device layer, includes a plurality of field oxide regions (generally designated 735) that provide electrical isolation between first and second gates 740, 745. In the illustrated embodiment, the first and second gates 740, 745 corresponds to gates of different circuit modules, or devices, e.g., SRAM and DSP circuit modules, analogous to the first and second circuit modules 525, 535. The first and second gates 740, 745 are formed using conventional processes over first and second gate oxide 750, 755, respectively. In patterning the first and second gates 740, 745, reticles of existing proven designs are employed. For instance, the first gate 740 is patterned using the gate layer reticle of a SRAM device set whereas the second gate 745 is patterned using the gate layer reticle of a DSP reticle set.

Figure 7C:
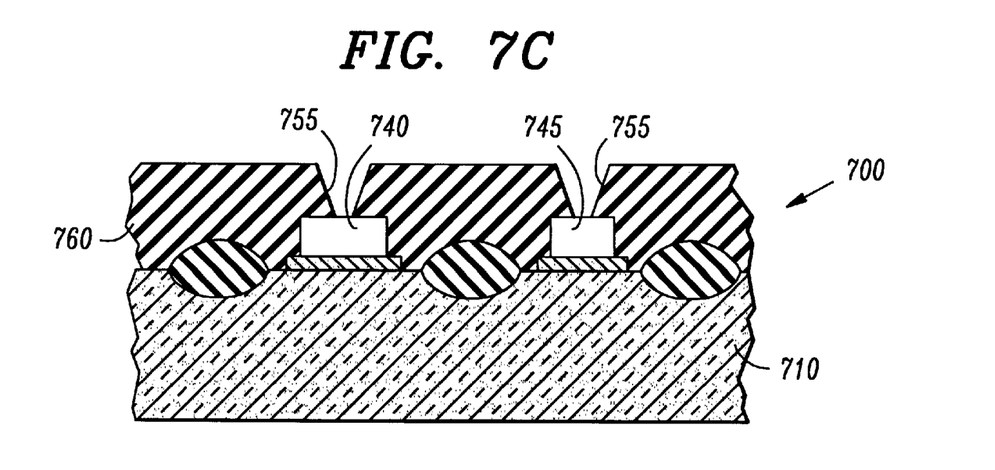
FIG. 7C illustrates a cross-sectional view of the semiconductor of FIG. 7A with a plurality of contact openings.

Turning now to FIG. 7C, illustrated is an exemplary cross-sectional view of the semiconductor 700 with a plurality of contact openings (generally designated 755). Following the formation of the gate layer, a first dielectric layer 760, which may be a deposited oxide, is formed over the gate layer. The contact openings' 755, or windows, patterns are formed on a photoresist (not shown), which has been deposited over the first dielectric layer 760, using the respective contact opening layer reticles of the previously mentioned SRAM and DSP reticle set. The photoresist is then developed and removed using conventional processes. The contact openings 755 are then formed through the first dielectric layer 760 in a conventional manner, such as by way of reactive ion etching.

Figure 7D:
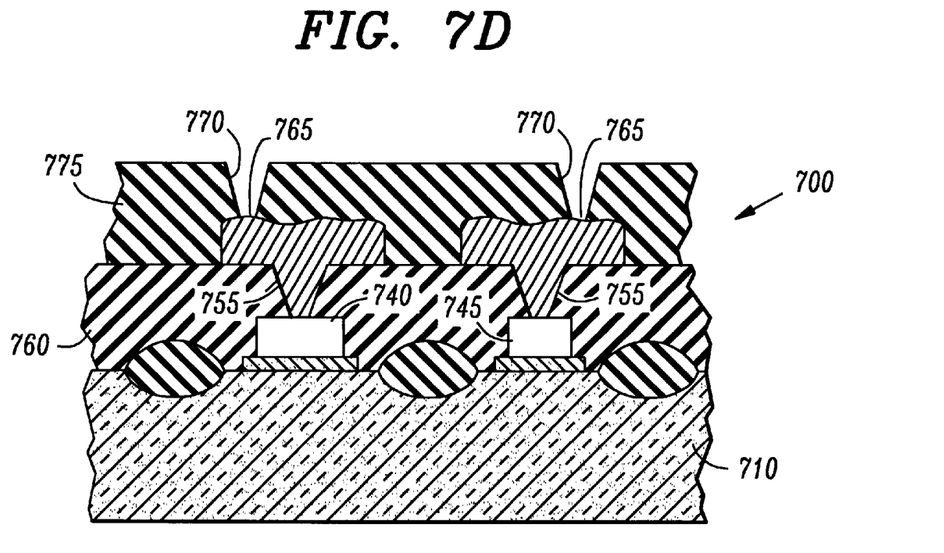
FIG. 7D illustrates a cross-sectional view of the semiconductor of FIG. 7A that includes a first interconnect layer.

Turning now to FIG. 7D, illustrated is an exemplary cross-sectional view of the semiconductor 700 that includes a first interconnect layer 775. Following the formation of the contact openings 755, an interconnect metal 765, such as aluminum, is deposited in the contact openings 755 to provide the first and second gates 740, 745 electrical connections to other parts of semiconductor 700. A second dielectric layer 775 is deposited over the first dielectric layer 760 and contact openings 755. In a similar fashion with the contact openings 755, a plurality of vial (generally designated 770) are patterned and formed in the second dielectric layer 775 using the respective first interconnect layer reticles of the SRAM and DSP reticle sets. The process is repeated until all the layers of the SRAM and DSP circuit modules have been formed.

Referring back to FIG. 6, it should be noted that the present invention is discussed in the context of the formation of a few layers of a semiconductor device for ease of explanation. Those skilled in the art are aware that semiconductor devices, such as SRAM, may require a device set of, e.g., 20 reticles. It should also be noted that the first and second circuit modules 525, 535 may have different numbers of reticles in their respective reticle set. Furthermore, at different layers, only one lithograph of a reticle pattern may be formed, depending on the fabrication process or device structure of the first and second circuit modules 525, 535. For example, the first circuit module 525 may require a set of 20 reticles, whereas the second circuit module may require a set of 35 reticles. Steps 620 and 630 are typically repeated until all the layers of the circuit are completed. Following the formation of the first and second circuit modules 525, 535, the process 600 proceeds to step 640.

In step 640, a dielectric layer is formed over the first and second circuit modules 525, 535 using conventional processes and materials, such as low pressure chemical vapor deposition (CVD) of tetraethyl orthosilicate (TEOS). Vias are then formed in the dielectric layer using conventional patterning and etching processes to provide electrical conductive paths to the first and second circuit modules' via pads 530, 540, respectively, and also to the bond pad frame's bond pads 520. An interconnect reticle is then exposed on a photoresist material that has been deposited over the dielectric layer, again using conventional processes. Following development of the photoresist, the resist material is removed using conventional etching processes, to form the interconnect pattern on the wafer 510. Conductive material, such as alumimun, may then be deposited on the wafer using conventional processes, such as physical vapor deposition (PVD), to form the conductive traces 550. It should be readily apparent to those skilled in the art that multiple interconnect levels are usually required in a semiconductor device and accordingly, step 640 may be repeated until all the interconnect levels are formed. It should also be noted that, in one advantageous embodiment, the interconnect reticles may not be required. The interconnects corresponding to the conductive traces 550 may be part of the reticle patterns of the first and second circuit modules 525, 535. In another embodiment, the lithographic equipment includes a reticle exchanger that allows the first and second modules' 525, 535 and the conductive traces' 550 reticles to be sequentially exchanged without manual intervention. Following the formation of the conductive traces 550, the process 600 ends in step 650.

The present invention provides for a significantly faster cycle-time between design and fabrication. Wafer processing to implement basic desired functional capabilities may begin without waiting for the reticle design, layout, glass generation and verification. Furthermore, only a few back end process reticles are required to be generated for most new designs, as opposed to a full reticle set, e.g., 17–29 reticles. The complex, expensive and most vulnerable (from a design standpoint) functional circuit modules may already be proven, qualified and in production. A few reticles may need to be generated for functional verification, and full sets of custom reticles (if desired) may be generated later when performance is verified. Additionally, design changes in prototypes could be accomplished after evaluation without incurring the cost of an entire new reticle set; only interconnect reticles need be revised. A library of characterized, qualified and standard functions in proven designs would also be available to circuit designers.

From the above, it should be apparent that the present invention provides a system for, and method of, manufacturing an IC and an IC manufactured by the method. The system includes: (1) a library of reticle primitives, at least two of the reticle primitives containing patterns corresponding to circuit modules to be contained in the IC, (2) an interconnect reticle containing patterns corresponding to interconnecting conductors for electrically coupling the circuit modules and (3) lithographic equipment that employs the at least two of the reticle primitives and the interconnect reticle to create a lithograph of the circuit modules and the interconnecting conductors.

Although the present invention has been described in detail, those skilled in the art should understand that they can make various changes, substitutions and alterations herein without departing from the spirit and scope of the invention in its broadest form.

What is claimed is:

1. A system for manufacturing an integrated circuit (IC), comprising:
    a library of reticle primitives, at least two of said reticle primitives containing patterns corresponding to circuit modules to be contained in said IC;
    an interconnect reticle containing only patterns corresponding to interconnecting conductors for electrically coupling said circuit modules; and
    lithographic equipment that employs said at least two of said recticle primitives and said interconnect reticle to create a lithograph of said circuit modules and said interconnecting conductors.

2. The system as recited in claim 1 further comprising at least one reticle containing patterns corresponding to a bond pad frame.

3. The system as recited in claim 1 wherein said at least two of said reticle primitives are free of patterns corresponding to bond pads for said circuit modules.

4. The system as recited in claim 1 wherein said at least two of said reticle primitives are free of patterns corresponding to protected drive transistors for said circuit modules.

5. The system as recited in claim 1 wherein said circuit modules are selected from the group consisting of:
    static random access memory (SRAM) modules,
    electrically eraseable programmable read-only memory (EEPROM) modules,
    field-programmable gate array (FPGA) modules,
    programmable logic array (PLA) modules,
    digital-to-analog (D/A) converter modules,
    analog-to-digital (A/D) converter modules,
    digital signal processor (DSP) modules,
    microprocessor modules,
    microcontroller modules,
    linear amplifier modules, and
    filter modules.

6. The system as recited in claim 1 wherein said lithographic equipment subjects each of said at least two of said reticle primitives to multiple exposures.

7. The system as recited in claim 1 wherein said lithographic equipment first employs said at least two of said recticle primitives to create a lithograph containing said circuit modules and subsequently employs said interconnect reticle to add said interconnecting conductors to said lithograph.

8. The system as recited in claim 1 wherein said lithographic equipment comprises a recticle exchanger that allows said at least two of said reticle primitives and said interconnect reticle to be sequentially exchanged.

9. A method of manufacturing an integrated circuit (IC), comprising the steps of:
    selecting at least two reticle primitives containing patterns corresponding to circuit modules to be contained in said IC from a library of reticle primitives;
    employing said at least two of said reticle primitives at a first time to create a lithograph of said circuit modules; and
    employing an interconnect reticle containing only patterns corresponding to interconnecting conductors for electrically coupling said circuit modules at a second time to create a lithograph of said interconnecting conductors to allow said circuit modules to cooperate to form said IC.

10. The method as recited in claim 9 further comprising the step of employing at least one reticle containing patterns corresponding to a bond pad frame.

11. The method as recited in claim 9 wherein said at least two of said reticle primitives are free of patterns corresponding to bond pads for said circuit modules.

12. The method as recited in claim 9 wherein said at least two of said reticle primitives are free of patterns corresponding to protected drive transistors for said circuit modules.

13. The method as recited in claim 9 wherein said circuit modules are selected from the group consisting of:
    static random access memory (SRAM) modules,
    electrically eraseable programmable read-only memory (EEPROM) modules,
    field-programmable gate array (FPGA) modules,
    programmable logic array (PLA) modules,
    digital-to-analog (D/A) converter modules,
    analog-to-digital (A/D) converter modules,
    digital signal processor (DSP) modules,
    microprocessor modules,
    microcontroller modules,
    linear amplifier modules, and
    filter modules.

14. The method as recited in claim 9 further comprising the step of repeating said steps of employing to create multiple of said ICs on a given wafer.

15. The method as recited in claim 9 wherein said step of employing said first reticle is carried out before said step of employing said second reticle.

16. The method as recited in claim 9 wherein said lithographic equipment comprises a recticle exchanger, said method further comprising the step of automatically exchanging said first and second reticles.

17. An integrated circuit (IC) manufactured by the process comprising the steps of:
    selecting at least two reticle primitives containing patterns corresponding to circuit modules to be contained in said IC from a library of reticle primitives;

employing said at least two of said reticle primitives at a first time to create a lithograph of said circuit modules; and employing an interconnect reticle containing only patterns corresponding to interconnecting conductors for electrically coupling said circuit modules at a second time to create a lithograph of said interconnecting conductors to allow said circuit modules to cooperate to form said IC.

18. The IC as recited in claim 17 further comprising the step of employing at least one reticle containing patterns corresponding to a bond pad frame.

19. The IC as recited in claim 17 wherein said at least two of said reticle primitives are free of patterns corresponding to bond pads for said circuit modules.

20. The IC as recited in claim 17 wherein said at least two of said reticle primitives are free of patterns corresponding to protected drive transistors for said circuit modules.

21. The IC as recited in claim 17 wherein said circuit modules are selected from the group consisting of:
   static random access memory (SRAM) modules,
   electrically eraseable programmable read-only memory (EEPROM) modules,
   field-programmable gate array (FPGA) modules,
   programmable logic array (PLA) modules,
   digital-to-analog (D/A) converter modules,
   analog-to-digital (A/D) converter modules,
   digital signal processor (DSP) modules,
   microprocessor modules,
   microcontroller modules,
   linear amplifier modules, and
   filter modules.

22. The IC as recited in claim 17 further comprising the step of repeating said steps of employing to create multiple of said ICs on a given wafer.

23. The IC as recited in claim 17 wherein said step of employing said at least two of said reticle primitives comprises the step of employing said at least two of said reticle primitives sequentially.

24. The IC as recited in claim 17 wherein said lithographic equipment comprises a recticle exchanger, said method further comprising the step of automatically exchanging said first and second reticles.

25. An integrated circuit (IC) manufactured by the process comprising the steps of:
   (a) employing at least one reticle containing patterns corresponding to a bond pad frame to create a lithograph of said bond pad frame on a wafer;
   (b) selecting at least two reticle primitives containing patterns corresponding to circuit modules to be contained in said IC from a library of reticle primitives, said at least two of said reticle primitives being free of patterns corresponding to bond pads and protected drive transistors for said circuit modules;
   (c) employing said at least two of said reticle primitives at a first time to create a lithograph of said circuit modules on said wafer;
   (d) employing an interconnect reticle containing only patterns corresponding to interconnecting conductors for electrically coupling said circuit modules at a second time to create a lithograph of said interconnecting conductors on said wafer to allow said circuit modules to cooperate to form said IC; and
   (e) repeating said steps (c) and (d) to create multiple of said ICs on said wafer.

26. The IC as recited in claim 25 wherein said reticle primitives in step (c) contain gate layer patterns of said circuit modules.

27. The IC as recited in claim 25 wherein said reticle primitives in step (c) contain contact openings layer patterns of said circuit modules.

28. The IC as recited in claim 25 wherein said reticle primitives in step (c) contain first interconnect layer patterns of said circuit modules.

29. The IC as recited in claim 25 wherein said circuit modules are selected from the group consisting of:
   static random access memory (SRAM) modules,
   electrically eraseable programmable read-only memory (EEPROM) modules,
   field-programmable gate array (FPGA) modules,
   programmable logic array (PLA) modules,
   digital-to-analog (D/A) converter modules,
   analog-to-digital (A/D) converter modules,
   digital signal processor (DSP) modules,
   microprocessor modules,
   microcontroller modules,
   linear amplifier modules, and
   filter modules.

30. The IC as recited in claim 25 wherein said step of employing said at least two of said reticle primitives comprises the step of employing said at least two of said reticle primitives sequentially.

31. The IC as recited in claim 25 wherein said lithographic equipment comprises a recticle exchanger, said method further comprising the step of automatically exchanging said first and second reticles.

32. A process of manufacturing an integrated circuit comprising:
   selecting at least two reticle primitives containing patterns corresponding to circuit modules to be contained in the integrated circuit;
   employing one of the at least two reticle primitives at a first time during the process to manufacture the integrated circuit;
   employing another one of the at least two reticle primitives at a second time during the process to manufacture the integrated circuit;
   providing an interconnect reticle containing patterns corresponding to interconnect structures for interconnecting the circuit modules; and
   employing the interconnect reticle, at a third time different from the first time and the second time, during the process to manufacture the integrated circuit.

33. The process of claim 32 wherein the first time is the same as the second time.

* * * * *